United States Patent
Chan et al.

(10) Patent No.: US 6,468,906 B1
(45) Date of Patent: Oct. 22, 2002

(54) PASSIVATION OF COPPER INTERCONNECT SURFACES WITH A PASSIVATING METAL LAYER

(75) Inventors: Lap Chan, San Francisco, CA (US); Kuan Pei Yap; Kheng Chok Tee, both of Selangor (MY); Flora S. Ip, Singapore (SG); Wye Boon Loh, Johor (MY)

(73) Assignees: Chartered Semiconductor Manufacturing Ltd.; National University of Singapore; Namyang Technological University of Singapore; Institute of Microelectronics, all of Singapore (SG)

( * ) Notice: Subject to any disclaimer, the term of this patent is extended or adjusted under 35 U.S.C. 154(b) by 0 days.

(21) Appl. No.: 09/617,009

(22) Filed: Jul. 14, 2000

Related U.S. Application Data

(62) Division of application No. 09/222,275, filed on Dec. 28, 1998, now Pat. No. 6,100,195.

(51) Int. Cl.$^7$ ................................................ H01L 21/44
(52) U.S. Cl. ................. 438/687; 438/680; 438/626; 438/627; 438/629; 438/633; 438/637; 257/622; 257/751; 257/752; 257/762
(58) Field of Search .................. 438/687, 626, 438/627, 624, 633, 637, 680; 257/622, 751, 752, 762

(56) References Cited

U.S. PATENT DOCUMENTS

| | | | |
|---|---|---|---|
| 4,574,095 A | 3/1986 | Baum et al. ................ | 427/53.1 |
| 5,470,789 A | 11/1995 | Misawa ....................... | 437/190 |
| 5,561,083 A | 10/1996 | Bollinger et al. ............ | 437/190 |
| 5,627,102 A | 5/1997 | Shinriki et al. .............. | 437/192 |
| 5,641,838 A | 6/1997 | Linde et al. ................. | 525/431 |
| 5,668,055 A | 9/1997 | Xu et al. ...................... | 438/637 |
| 5,674,787 A | 10/1997 | Zhao et al. .................. | 437/230 |
| 5,677,244 A | 10/1997 | Venkatraman .............. | 437/198 |
| 5,950,102 A | 9/1999 | Lee ............................ | 438/619 |
| 6,016,000 A * | 1/2000 | Moslehi ....................... | 257/522 |
| 6,046,108 A * | 4/2000 | Liu et al. ..................... | 438/687 |

OTHER PUBLICATIONS

An Abstract by J.J. Yang et al., "Improvement of Thermal Stability of Hydrogen Silsesquioxane low–k Polymer Using E–beam Curing", Material Research Society Symposium Series, Apr. 14, 1998.

* cited by examiner

*Primary Examiner*—David Nelms
*Assistant Examiner*—Reneé R. Berry
(74) *Attorney, Agent, or Firm*—George O. Saile; Rosemary L. S. Pike; Graham S. Jones, II

(57) ABSTRACT

An interconnect line on an IMD layer on a semiconductor device is formed in an interconnect hole in the IMD layer. The interconnect hole has walls and a bottom in the IMD layer. A diffusion barrier is formed on the walls and the bottom of the hole. Fill the interconnect hole with a copper metal line. Perform a CMP step to planarize the device and to remove copper above the IMD layer. Deposit a passivating metal layer on the surface of the copper metal line encapsulating the copper metal line at the top of the hole. Alternatively, a blanket deposit of a copper metal line layer covers the diffusion layer and fills the interconnect hole with a copper metal line. Perform a CMP process to planarize the device to remove copper above the IMD layer. Deposit a passivating metal layer on the surface of the copper metal line encapsulating the copper metal line at the top of the hole in a self-aligned deposition process.

17 Claims, 10 Drawing Sheets

PASSIVATION OF COPPER INTERCONNECT SURFACES WITH A PASSIVATING METAL LAYER

This is a division of patent application Ser. No. 09/222,275, filing date Dec. 28, 1998, now U.S. Pat. No. 6,100,195, Passivation Of Copper Interconnect Surfaces With A Passivating Metal Layer, assigned to the same assignee as the present invention.

BACKGROUND OF THE INVENTION

1. Field of the Invention

This invention relates to interconnects formed in semiconductor devices, and more particularly to copper interconnects formed in Inter-Metallic Dielectric (IMD) layers.

2. Description of Related Art

As semiconductor device dimensions are constantly being scaled down to the deep submicron regime, the current metallization scheme requires revision.

U.S. Pat. No. 5,674,787 of Zhao et al. for "Selective Electroless Copper Deposited Interconnect Plugs for ULSI Applications" shows selective Cu electroless deposition in a via trench hole using a seed layer. An electroless copper deposition method selectively forms encapsulated copper plugs to connect conductive regions of a semiconductor device. A contact displacement technique forms a thin activation copper layer on a barrier metal layer, e.g. TiN, which is present as a covering layer on an underlying metal layer. Copper is deposited in the via by an electroless auto-catalytic process. Electroless copper deposition continues until the via is almost filled which leaves sufficient room at the top for an upper encapsulation to be formed there, but first the device is rinsed in DI (deionized) water to remove the electroless deposition solution. Then after the rising away of the electroless copper solution, a cap barrier layer, from 500 Å to about 1500 Å thick, is formed of a variety of metals or metal alloys such as Ni, Co, Ni—Co alloy, CoP, NiCoP, or NiP from another electroless solution. The bottom barrier layer and the cap barrier layer complete the full encapsulation of the copper plug via.

U.S. Pat. No. 5,470,789 of Misawa for "Process for Fabricating Integrated Circuit Devices" produces a TiN/Cu interconnect having a capping layer formed of TiN unlike the copper alloy metal cap layer of this invention.

SUMMARY OF THE INVENTION

An interconnect line on an IMD layer on a semiconductor device is formed in an interconnect hole in the IMD layer. The interconnect hole has walls and a bottom in the IMD layer. A diffusion barrier is formed on the walls and the bottom of the hole. Deposit copper to fill the interconnect hole with a copper metal plug. A passivating metal layer is deposited selectively on the surface of the copper metal deposit encapsulating the copper metal plug.

Alternatively, a blanket deposit of a copper metal layer covers the diffusion layer and fills the interconnect hole with a copper metal deposit. Perform a CMP process to planarize the device to remove both copper and the barrier metal at the IMD layer. Depositing a passivating metal layer on the surface of the copper metal deposit encapsulating the copper metal at the top of the hole in a self-aligned deposition process.

BRIEF DESCRIPTION OF THE DRAWINGS

The foregoing and other aspects and advantages of this invention are explained and described below with reference to the accompanying drawings, in which:

FIGS. 2A–2K show fragmentary sectional views of the process of manufacturing a portion of a semiconductor device.

DESCRIPTION OF THE PREFERRED EMBODIMENT

First Problem

With the reduction in device dimensions to deep submicron regimes such as a sub 0.25 µm regime, we believe that copper emerges as the leading candidate to replace aluminum as the interconnect metal of choice because of its lower resistivity and longer electromigration lifetime. One of the most serious drawbacks of copper metallization is the instability of copper in an oxidizing ambient which leads to formation of copper oxide which degrades the electrical performance of the device and causes the issue of reduction in reliability of the devices. Copper is unlike aluminum, which is a self-passivating or self-healing metal which forms a protective layer of aluminum oxide. To the contrary, copper oxide continues to oxidize the remaining copper in the structure, eventually consuming most or all of the copper, especially in the thin films of copper employed in thin film devices, such as the semiconductor devices of this invention. Thus, we have found that copper needs to be passivated for protection from oxidation prior to thermal treatment of the semiconductor device.

FIGS. 1A–1G illustrate a problem which led to development of this invention, showing fragmentary sectional views of semiconductor device 10 during a process of manufacturing a portion thereof. This process, as described below, was considered for use and the problems found therewith have led to the development this invention, but found to be lacking as will be explained at the end of the description thereof.

Figure 1:
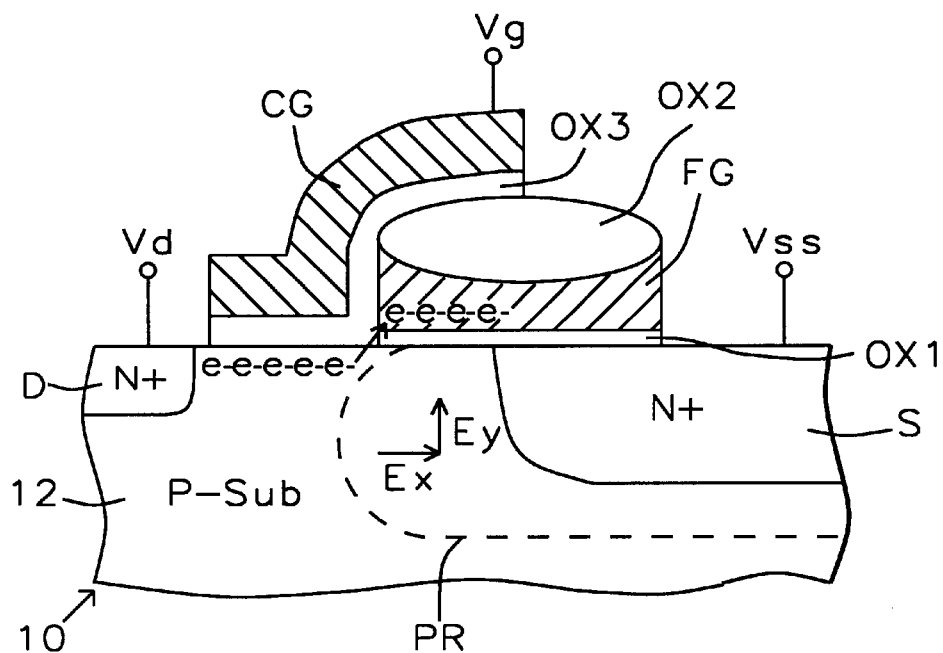
FIGS. 1 and 2 describe an embodiment of the instant invention.
Figure 2:
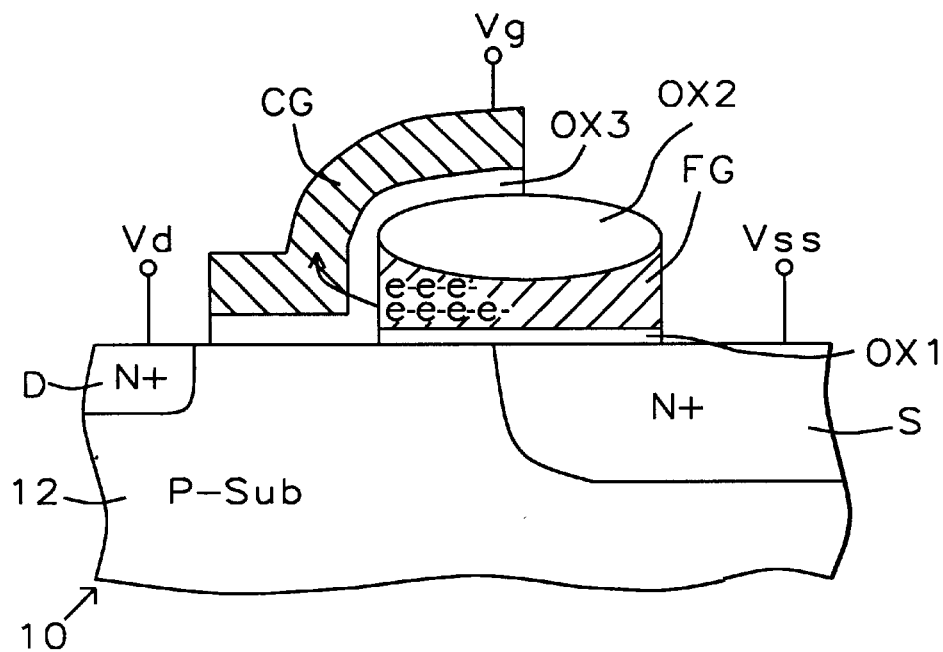
Figure 1A:
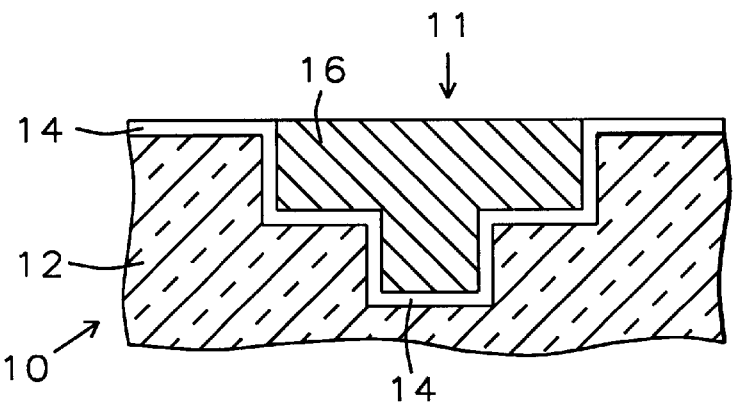
FIGS. 1A–1G illustrate a problem which led to development of this invention, showing fragmentary sectional views of a device during a manufacturing process.

FIG. 1A shows a fragmentary sectional view of a portion of a semiconductor device 10 in early stage of the process of manufacturing in accordance with the steps shown in FIGS. 1A–1E. An Inter-Metallic Dielectric (IMD) layer 12 composed of a material such as an oxide of silicon formed by a silane ($SiH_4$) or TEOS process or a Spin on Polymer (SOP), which is formed on the device 10 has a filled trench hole 13 that has been coated with a thin layer of a metal nitride, diffusion barrier layer 14 composed of a refractory metal nitride selected from the group consisting of titanium nitride (TiN), tantalum nitride (TaN) and tungsten nitride (WN). Then a lower interconnect copper line 16 has been formed to fill the remaining space in the trench hole 13. Lower interconnect copper line 16 is bonded to the metal nitride, diffusion barrier layer 14.

As to the Spin on Polymer (SOP), U.S. Pat. No. 5,641,838 of Linde et al for "Thermostable Coating Materials" describes "intermediate compounds capable of being applied to a semiconductor precursor by spin-on methods which exhibit good planarity and gap fill characteristics. The patent describes "a perylene dimide" and "a poly (silsesquioxane) used for this purpose.

An abstract by J. J. Yang et al. for "Improvement of Thermal Stability of Hydrogen Silsesquioxane low-k Polymer Using E-beam Curing", Material Research Society Symposium Series, states "Hydrogen-Silsesquioxane (HSSQ) spin-on polymer is one of the promising low-k dielectric polymers as interlayer dielectric for multilevel interconnects."

Figure 1B:
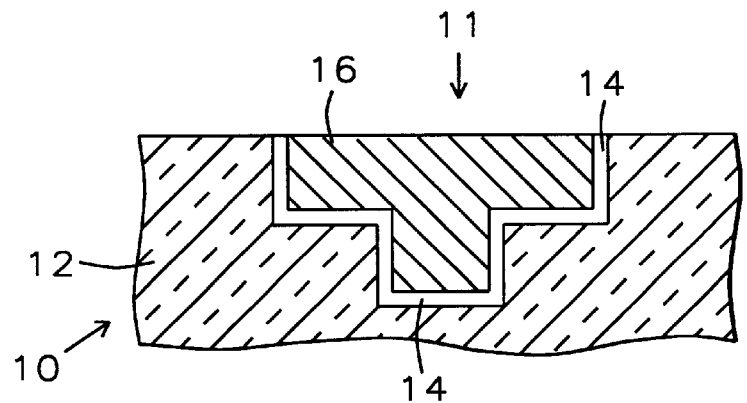

FIG. 1B shows the device 10 of FIG. 1A after the following step of CMP (Chemical Mechanical Polishing) of the copper line 16 to planarize the surface of the device 10 by removing that portion of the copper line 16 and of the diffusion barrier metal nitride 14 which extends above the surface of the IMD layer 12.

Figure 1C:
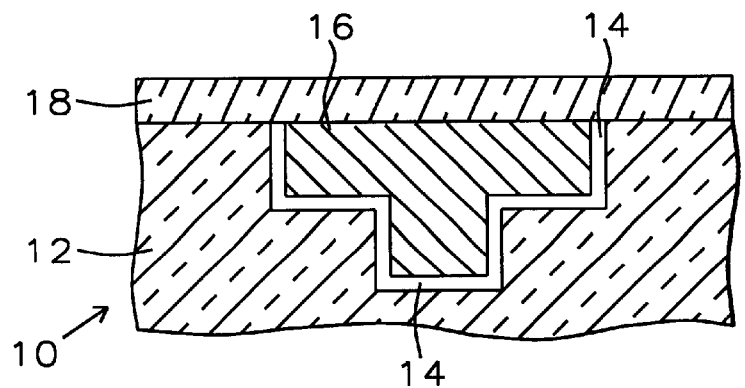

FIG. 1C shows the device 10 of FIG. 1B after a blanket silicon nitride ($Si_3N_4$) dielectric layer 18 has been deposited upon the surface of device 10 covering the top surface of the planarized lower interconnect copper line 16, the exposed portion of the surface of the IMD layer 12 and the edges of the diffusion barrier metal layer 14 on the top of device 10 between the IMD layer 12 and the copper line 16.

Figure 1D:
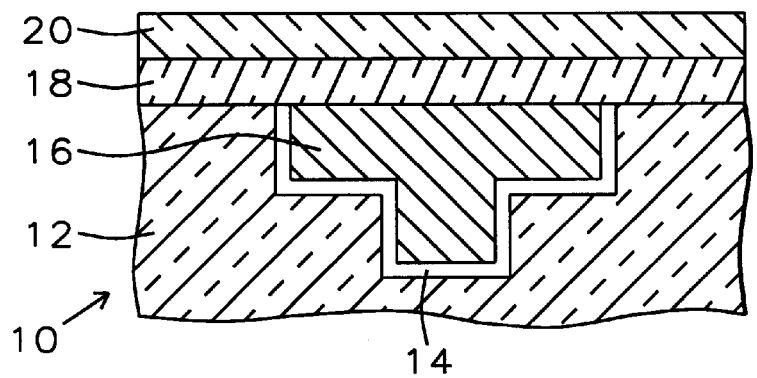

FIG. 1D shows the device 10 of FIG. 1C after a blanket silicon oxide layer 20 such as an Inter-Metallic Dielectric (IMD) layer composed of a material such as an oxide of silicon has been formed on top of silicon nitride layer 18. Silicon nitride layer 18 has been formed by a TEOS process or a Spin-on-Glass (SOG).

Figure 1E:
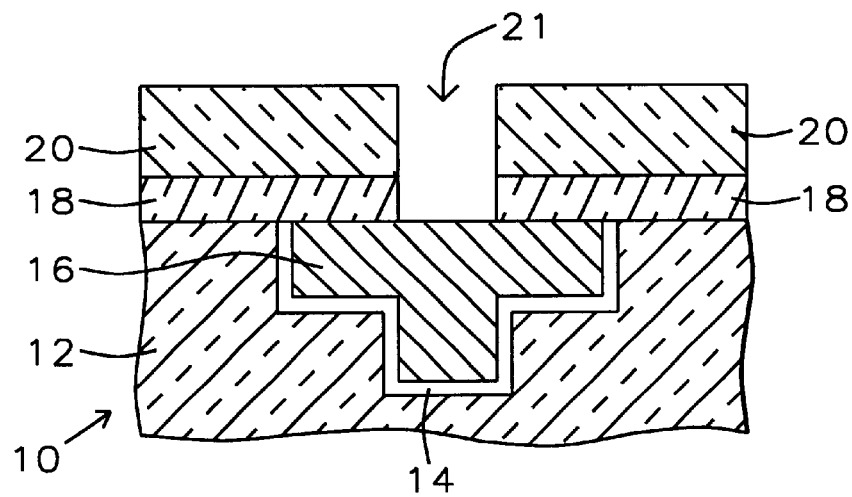

FIG. 1E shows the device 10 of FIG. 1D after the silicon oxide layer 20 has been patterned (using photolithographic and etching processes well known to those skilled in the art) to form a hard mask of layer 20 with a trench hole 21 etched therethrough. Etching through hole 21 continues until the trench hole 21 is etched further down through silicon nitride layer 18 to the surface of lower interconnect copper line 16. Thus, the contact trench hole 21 has been etched down through silicon oxide layer 20 and silicon nitride layer 18 to expose a substantial portion of the surface of lower copper interconnect line 16.

Figure 1F:
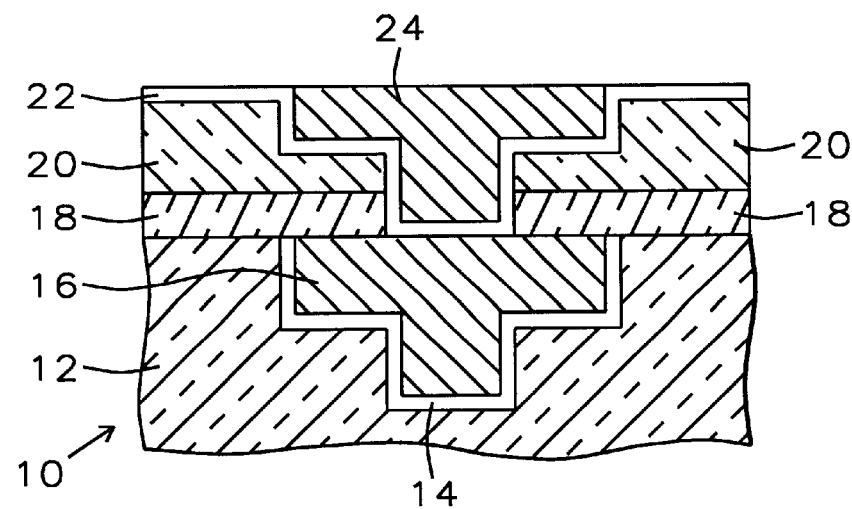

FIG. 1F shows the device 10 of FIG. 1E after the trench hole 21 has been widened on the margins slightly above silicon nitride layer 18 to make a larger trench hole 21 (now filled).

Then a thin film, metal nitride, barrier layer 22 was formed lining the trench hole 21 and the top surface of silicon oxide layer 20 was coated with thin film barrier layer 22. Thin film, metal nitride, diffusion barrier layer 22 composed of an electrically conductive, refractory metal nitride selected from the group consisting of titanium nitride (TiN), tantalum nitride (TaN) and tungsten nitride (WN) covering the exposed surface portion of lower copper interconnect line 16, on the exposed surfaces of silicon nitride layer 18 in trench hole 21, and on the exposed surfaces of upper IMD layer 20.

Then an upper copper interconnect line 24 is formed in the space remaining in the trench hole 21 bonded to the upper diffusion barrier layer 22 and in electrical connection through upper diffusion barrier metal nitride layer 22 to the lower interconnect copper line 16.

Figure 1G:
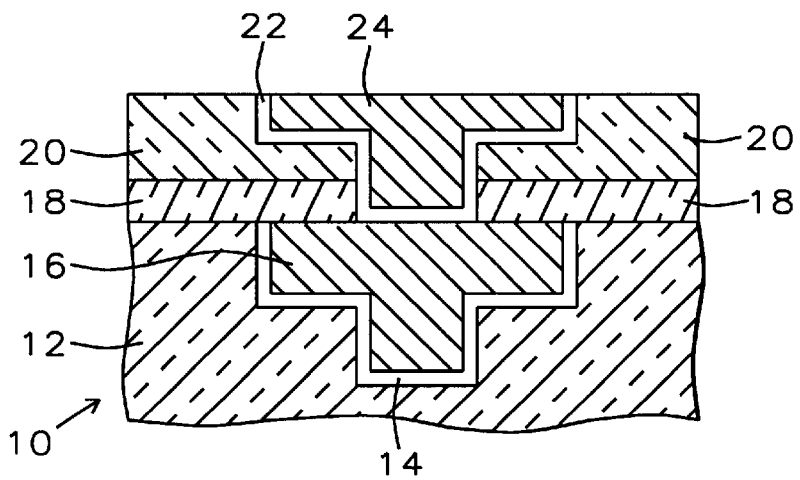

FIG. 1G shows the device 10 of FIG. 1F after a second copper CMP (Chemical Mechanical Polishing) of the copper interconnect line 24 to planarize the surface of the device 10 by removing that portion of the copper line 24 and of the upper diffusion barrier metal nitride 22 which extends above the surface of the IMD layer 12.

In summary, the process of FIGS. 1A–1G which has been considered for use involves a copper CMP (Chemical Mechanical Polishing) step and deposition of a silicon nitride ($Si_3N_4$) capping layer 18. Next, is a step of deposition of the IMD (Inter Metal Dielectric) layer 20, followed by etching of the silicon oxide layer 20 and the silicon nitride layer 18. This approach may result in higher RC (Resistance Capacitance) delay and formation of copper halides and copper oxides. The RC delay is caused by the higher dielectric constant of silicon nitride.

First Preferred Embodiment

FIGS. 2A–2K illustrate a solution in accordance with this invention to the problem described above, showing fragmentary sectional views of a semiconductor device 50 during a process of manufacture thereof.

Figure 2A:
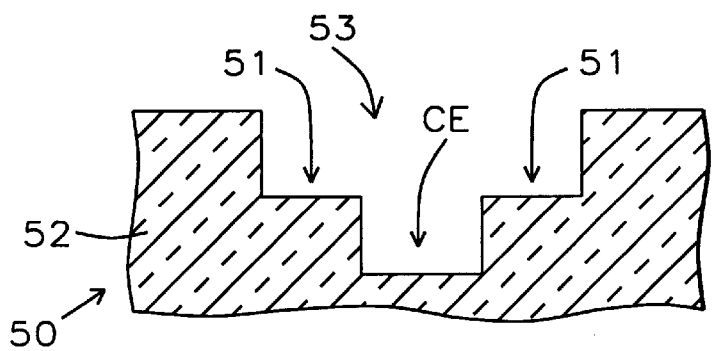
FIGS. 2A–2K illustrate a solution in accordance with this invention to the problem of FIGS. 1A–1G.

FIG. 2A shows a fragmentary sectional view of a portion of a semiconductor device 50 in early stage of the process of manufacturing in accordance with the steps shown in FIGS. 2A–2K comprising a lower Inter-Metallic Dielectric (IMD) layer 52 composed of a material such as an oxide of silicon, such as Spin on Glass (SOG) in which is formed an interconnect trench hole 53 which is preferably deeper in the center CE and has ledges 51 on either side of center CE. The ledges 51 are shallower than the center CE.

Figure 2B:
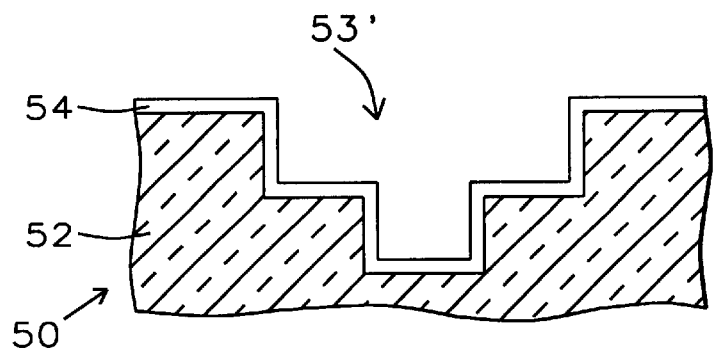

FIG. 2B shows the device 50 of FIG. 2A after forming a diffusion barrier layer 54 on the IMD layer 52 including the top surface of layer 52 as well as covering the walls, ledges and the bottom of the trench hole 53 in layer 52. The thin layer of diffusion barrier layer 54 are composed of a refractory metal nitride is preferably composed of a material selected from the group consisting of titanium nitride (TiN), tantalum nitride (TaN) and tungsten nitride (WN).

Figure 2C:
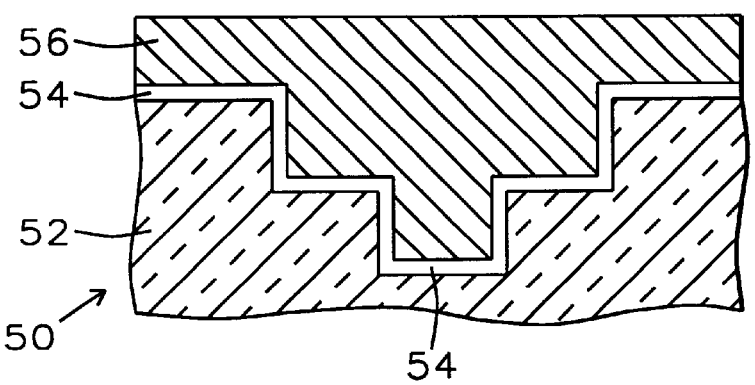

FIG. 2C shows the device 50 of FIG. 2B after a lower interconnect copper line 56 has been formed filling the space 53' remaining in the trench hole 53 (after depositing layer 54) and copper line has been deposited to cover the device 50 to a level well above the uppermost surface of layer 54. The copper line 56 is bonded to the diffusion barrier layer 54.

Figure 2D:
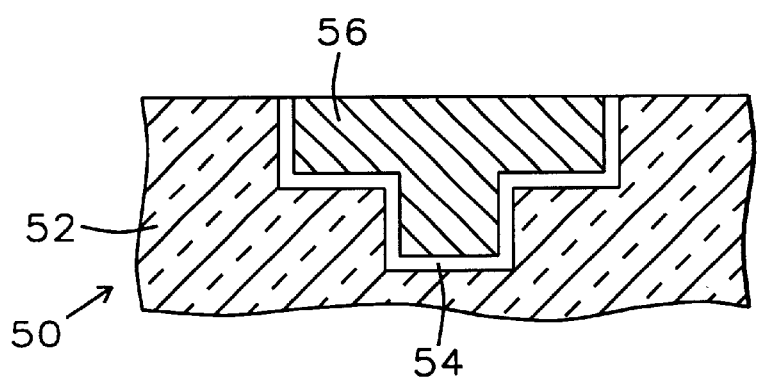

FIG. 2D shows the device 50 of FIG. 2C after the top surface of copper line 56 and diffusion layer 54 have been planarized by CMP (Chemical Mechanical Polishing) step to be level with the IMD layer 52.

Figure 2E:
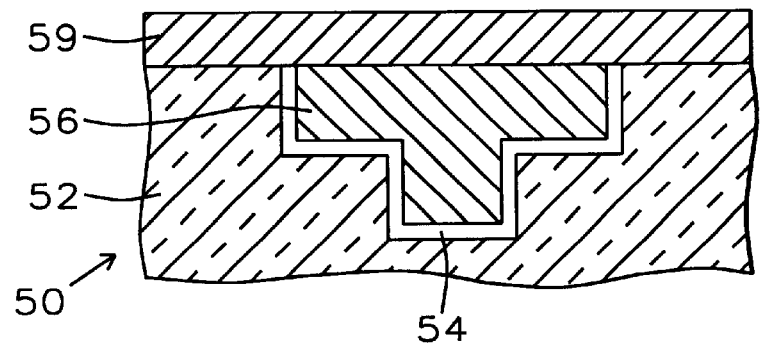

FIG. 2E shows the device 50 of FIG. 2D after a blanket aluminum (Al), platinum (Pt) or palladium (Pd) passivation layer 59 has been formed on the surface of device 50 with a thickness from about 50 Å to about 300 Å forms a bilayer of copper 56 and aluminum (Al), platinum (Pt) or palladium (Pd) 59. Layer 59 overlies the copper line 56 and the exposed surfaces of the IMD layer 52.

Figure 2F:
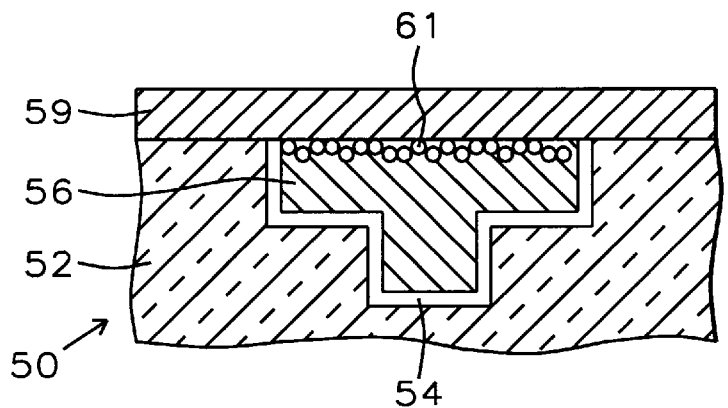

FIG. 2F shows device 50 of FIG. 2E after annealing of device 50 at a temperature from about 200° C. to about 400° C. forming an alloy 61 of copper-aluminum (Cu—Al), copper-platinum (Pt) (Cu—Pt) or copper-palladium (Pd) (Cu—Pd) alloy at the interface between copper layer 56 and passivation layer 59.

Figure 2G:
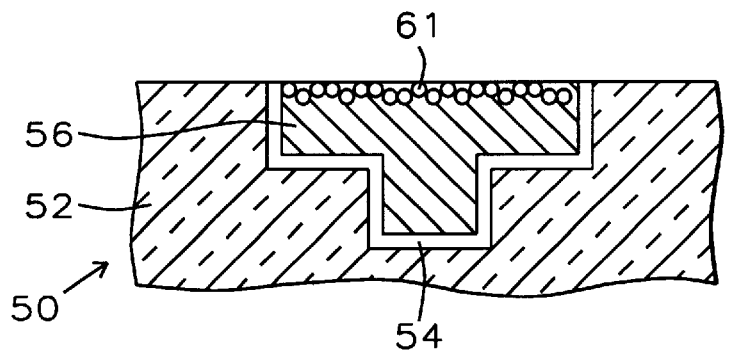

FIG. 2G shows the device 50 of FIG. 2F after etching the device in an acid etchant solution selective to remove aluminum (Al), platinum (Pt) or palladium (Pd) from the surface of device 50, leaving the copper-aluminum (Al), platinum (Pt) or palladium (Pd) alloy 61 in place.

Figure 2H:
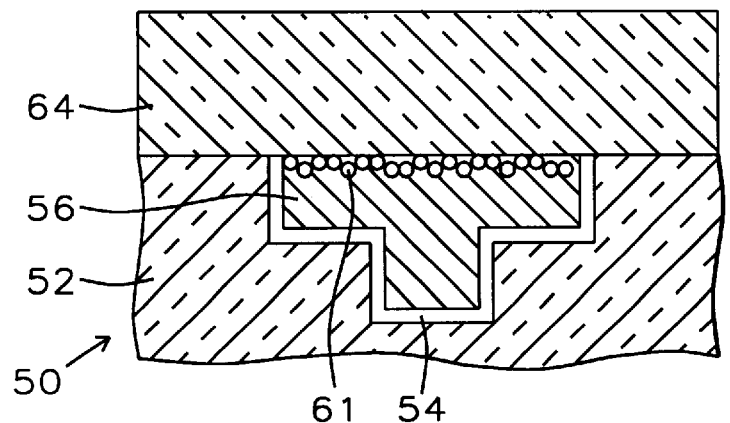

FIG. 2H shows the device 50 of FIG. 2F after formation of a blanket Inter-Metallic Dielectric (IMD) layer 64 composed of a material such as an oxide of silicon, such as Spin on Polymer (SOP) over the alloy layer 61, the edge of diffusion barrier layer 54, and the lower IMD layer 52.

Figure 2I:
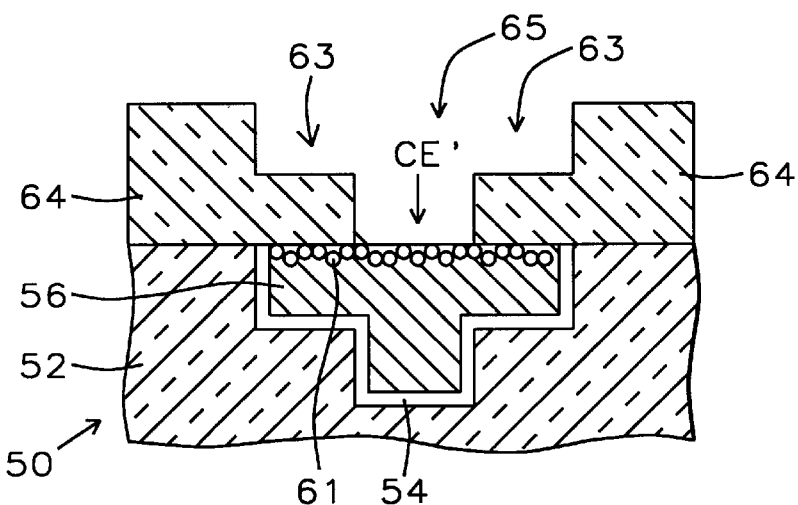

FIG. 2I shows the device 50 of FIG. 2H after patterning using conventional masking and etching techniques to form of an interconnect trench hole 65 which is preferably deeper in the center CE' and has ledges 63 on either side of the center CE'. Ledges 63 are shallower than the center CE'.

Figure 2J:
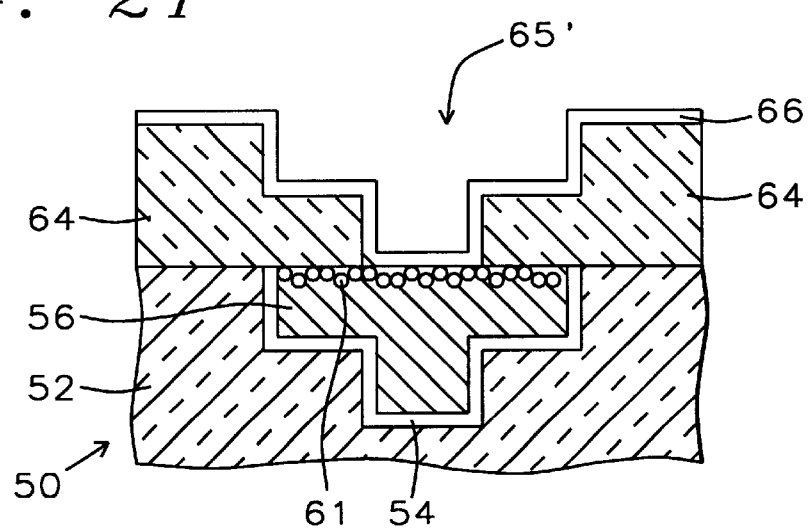

FIG. 2J shows the device 50 of FIG. 2I after formation of a diffusion barrier layer 66 covering the top surface of IMD layer 64 as well as the walls, ledges and the bottom of the trench hole 65 in IMD layer 64. The thin layer of a diffusion barrier layer 66 is preferably composed of a refractory metal nitride selected from the group consisting of titanium nitride (TiN), tantalum nitride (TaN) and tungsten nitride (WN).

Figure 2K:
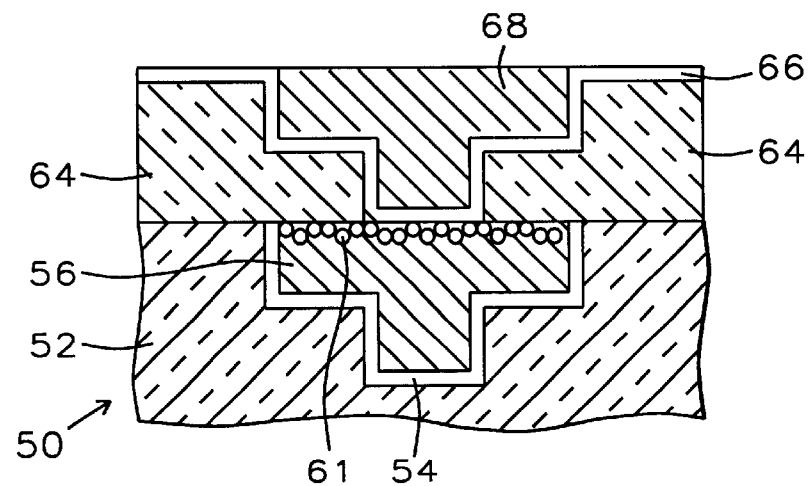

FIG. 2K shows the device 50 of FIG. 2J after an upper interconnect copper line 68 has been formed filling space 65' remaining in the trench hole 65 (after depositing layer 66). Upper interconnect copper line 68 is bonded to diffusion barrier layer 66. Then the top surface of upper interconnect copper line 68 is planarized by CMP (Chemical Mechanical Polishing) step to be level with IMD layer 54.

Second Preferred Embodiment

If the exposed surface of the copper layer of a device in accordance with this invention can be selectively covered with an electroless metal barrier, e.g. Pd from about 50 Å to about 300 Å thick, it will eliminate the step of patterning the passivation layer in a self-aligned encapsulation. Another advantage of this process is elimination of the removal/etching of the extra passivating material on the non-copper surfaces of the device, such as TEOS. It can also serve as adhesion and diffusion barrier. In addition, electroless deposition has the advantage of low cost and low processing temperatures.

FIGS. 3A–3D, which illustrate a solution to the problem described above, show fragmentary sectional views a process of manufacture of a portion of a semiconductor device 80.

Figure 3A:
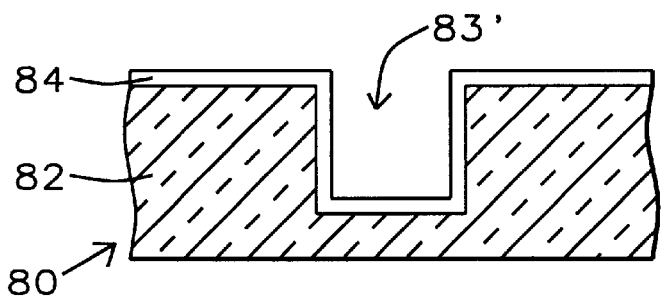
FIGS. 3A–3D, which illustrate a solution to the problem described above, show fragmentary sectional views a device during manufacture of a portion of a semiconductor device in accordance with this invention.

FIG. 3A shows a fragmentary sectional view of a portion of a semiconductor device 80 in early stage of the process of manufacturing in accordance with the steps shown in FIGS. 3A–3D comprising a lower Inter-Metallic Dielectric (IMD) layer 82 composed of a material such as an oxide of silicon, such as Spin on Polymer (SOP) in which is formed an interconnect trench hole 83' shown after formation of thin film, metal nitride, diffusion barrier layer 84 therein on device 80.

Thin film, metal nitride, diffusion barrier layer 84 covers the IMD layer 82 including the top surface of layer 82 as well as covering the walls, ledges and the bottom of the trench hole 83' in layer 82. The thin film, metal nitride, diffusion barrier layer 84 is composed of a refractory metal nitride which is preferably composed of a material selected from the group consisting of titanium nitride (TiN), tantalum nitride (TaN) and tungsten nitride (WN).

Figure 3B:
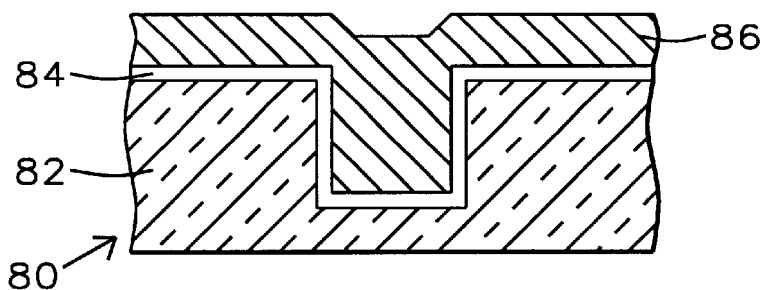

FIG. 3B shows the device 80 of FIG. 3A after a blanket deposition of copper on device 80 to form the lower interconnect copper line 86, covering layer 84 and filling the space in the trench hole 83' inside the diffusion barrier layer 84. The copper line 86 is bonded to the diffusion barrier layer 84. The copper is deposited by a process of copper deposition selected from Chemical Vapor Deposition (CVD), IMP, or plating by an electroless or electroplating process.

Figure 3C:
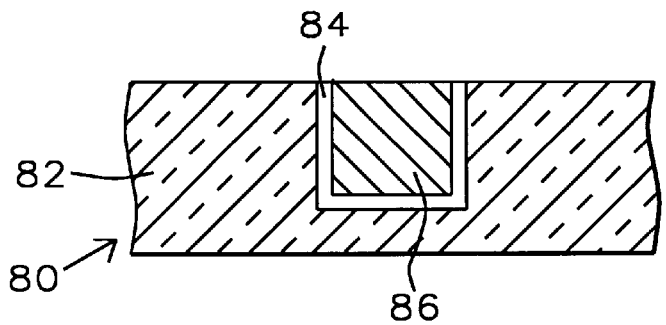

FIG. 3C shows the device 80 of FIG. 3B after the top surface of copper line 86 has been planarized by CMP (Chemical Mechanical Polishing) step to be level with the IMD layer 82.

Figure 3D:
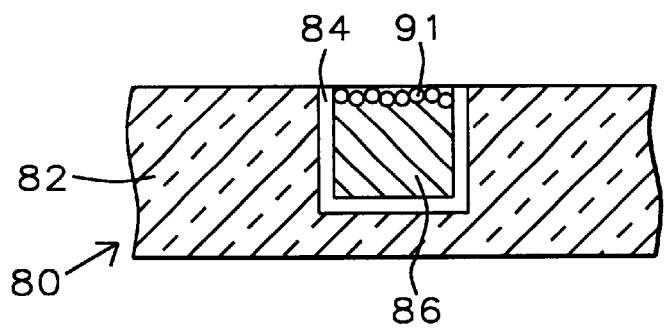

FIG. 3D shows device 80 of FIG. 3C after electroless plating of a metal barrier layer 91 of aluminum (Al), platinum (Pt) or palladium (Pd) has been formed on top of the copper line 86 with a thickness from about 50 Å to about 300 Å thick.

Figure 4A:
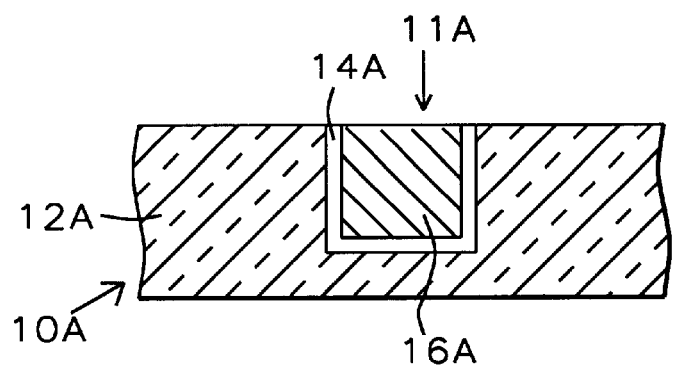
FIGS. 4A–4C show fragmentary sectional views of a device during manufacture of a portion of a semiconductor device with a process modified from FIGS. 1A–1G.
Figure 4B:
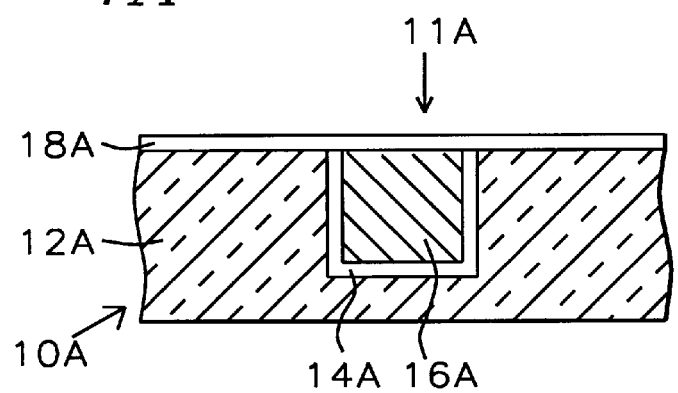
Figure 4C:
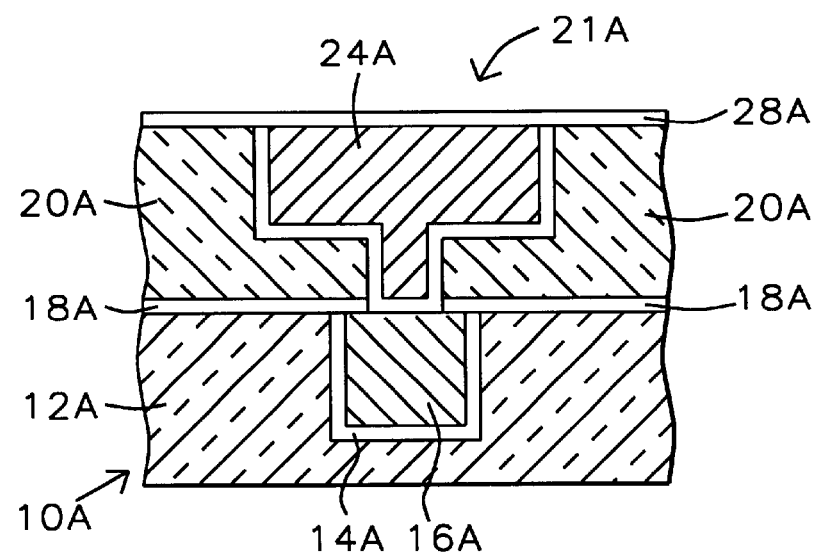

FIGS. 4A–4C, which illustrate a problem which led to development of the second embodiment of this invention. FIGS. 4A–4C show fragmentary sectional views of a process of manufacture of a portion of a semiconductor device 10A. This process, as described below, was considered before this invention, but found to be lacking as will be explained at the end of the description thereof.

FIG. 4A shows a fragmentary sectional view of a portion of a semiconductor device 10A in an early stage of the process of manufacturing in accordance with the steps shown in FIGS. 4A–4C. An Inter-Metallic Dielectric (IMD) layer 12A composed of a material, such as an oxide of silicon, such as Spin on Polymer (SOP), which is formed on the device 10A has a filled trench hole 11A that has been coated with a thin film, metal nitride diffusion barrier layer 14A. Barrier layer 14A is composed of a refractory metal nitride selected from the group consisting of titanium nitride (TiN), tantalum nitride (TaN) and tungsten nitride (WN). Then a lower interconnect copper line 16A has been formed to fill the remaining space in the trench hole 11A. Lower interconnect copper line 16A is bonded to the diffusion barrier layer 14A. The followed step is CMP (Chemical Mechanical Polishing) of the copper line 16A to planarize the surface of the device 10A by removing that copper and the diffusion barrier layer 14A where it extends above the surface of IMD layer 12A.

FIG. 4B shows the device 10A of FIG. 4A after a blanket silicon nitride ($Si_3N_4$) dielectric layer 18A deposited by PECVD (Plasma Enhanced Chemical Vapor Deposition) with a thickness of about 200 Å A has been deposited upon the surface of device 10A covering the top surface of the planarized lower interconnect copper line 16A and the exposed portions of the surface of IMD layer 12A and layer 14A on the top of device 10A.

FIG. 4C shows the device 10A of FIG. 4B after a blanket silicon oxide layer 20A such as an Inter-Metallic Dielectric (IMD) layer composed of a material such as an oxide of silicon has been formed on top of silicon nitride layer 18A.

The silicon oxide layer 20A has been patterned into a hard mask with a trench hole 21A etched therethrough. Etching continues until the trench hole 21A is etched further down through silicon nitride layer 18A to the surface of lower interconnect copper line 16A. Thus, the contact trench hole 21A has been etched down through silicon oxide layer 20A and silicon nitride layer 18A to expose a substantial portion of the surface of lower copper interconnect line 16A.

The trench hole 21A has been widened on the margins slightly above diffusion barrier layer 14A. The silicon nitride layer 18A on top of the copper line 16A will cause an RC delay. Overetching of the silicon nitride layer 18A will harm the first copper metal layer 16A with a chance of contamination by increasing the presence of copper halides which are non-volatile. Silicon nitride layer 18A is used as a passivation layer for trench hole 21A (now filled). Then the top surface of device 10A was coated with upper diffusion barrier layer 22A with the result that the trench hole 21A was lined with barrier layer 22A and at the same time the top surface of silicon oxide layer 20A was coated with barrier layer 22A. Barrier layer 22A comprises a thin layer composed of a refractory metal nitride selected from the group consisting of titanium nitride (TiN), tantalum nitride (TaN) and tungsten nitride (WN) covering the exposed surface portion of lower copper interconnect line 16A, on the exposed surfaces of silicon nitride layer 18A in trench hole 21A, and on the exposed surfaces of upper IMD layer 20A. Then an upper copper interconnect line 24A is formed in the space remaining in the trench hole 21A bonded to the upper diffusion barrier layer 22A and in electrical connection through upper diffusion barrier layer 22A to the lower interconnect copper line 16A followed by a second copper CMP (Chemical Mechanical Polishing) step to be level with IMD layer 20A.

Next, device 10A is coated with blanket silicon nitride ($Si_3N_4$) dielectric layer 28A deposited by PECVD (Plasma Enhanced CVD) with a thickness of about 200 Å has been deposited upon the surface of device 10A covering the top surface of the planarized lower interconnect copper line 24A, the edge of barrier layer 22A and the exposed portions of the surface of IMD layer 20A on the top of device 10A.

A disadvantage of the process of FIGS. 4A to 4C is that the silicon nitride on the non-copper layer has to be etched back for the following connection through layer 18A in FIG. 4C forming the following the refractory metal nitride as upper diffusion barrier layer 22A.

Another disadvantage is the silicon nitride between the copper line 16A and copper line 24A will cause an RC delay.

Furthermore, there is the problem that overetching of the silicon nitride layer 18A can harm the first copper metal line 16A increasing as copper halides are non-volatile.

Figure 5A:
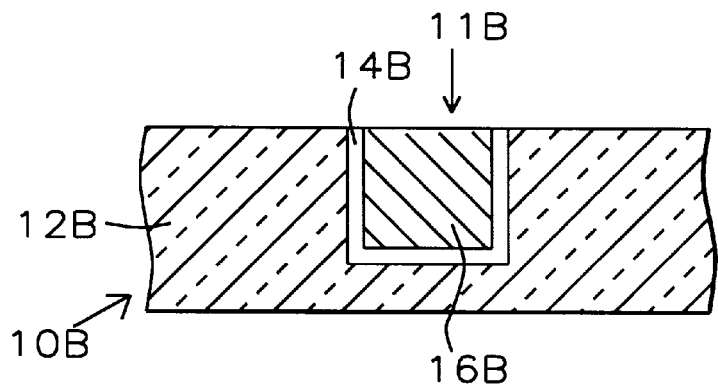
FIGS. 5A–5C show fragmentary sectional views of a device during a process of manufacture of a portion of a semiconductor device with a process modified from FIGS. 1A–1G.
Figure 5B:
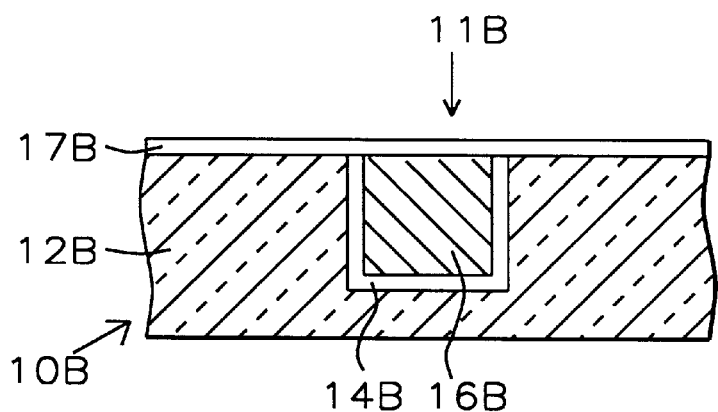
Figure 5C:
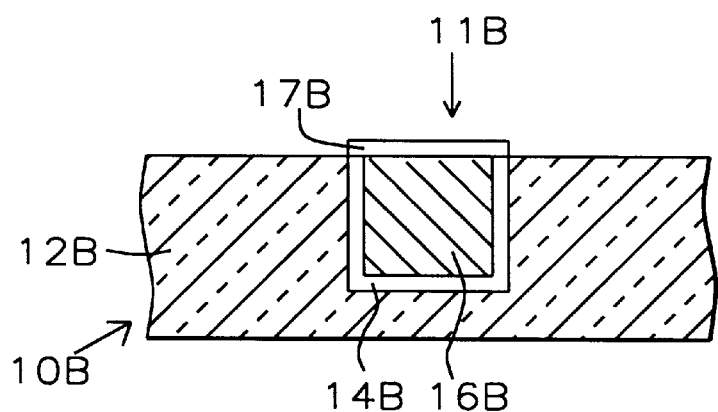

FIGS. 5A–5C, which illustrate a problem which led to development of the second embodiment of this invention. FIGS. 5A–5C show fragmentary sectional views of a process of manufacture of a portion of a semiconductor device 10B. This process, as described below, was considered before this invention, but found to be lacking as will be explained at the end of the description thereof.

FIG. 5A shows a fragmentary sectional view of a portion of a semiconductor device 10B in early stage of the process of manufacturing in accordance with the steps shown in FIGS. 5A–5C. An Inter-Metallic Dielectric (IMD) layer 12B composed of a material such as an oxide of silicon, such as Spin on Polymer (SOP), which is formed on the device 10B has a trench hole 11B that has been coated with a thin layer of a diffusion barrier layer 14B composed of a refractory metal nitride selected from the group consisting of titanium nitride (TiN), tantalum nitride (TaN) and tungsten nitride (WN). Then a lower interconnect copper line 16A has been formed to fill the remaining space in the trench hole 11B. Lower interconnect copper line 16A is bonded to the diffusion barrier layer 14B. The followed step is CMP (Chemical Mechanical Polishing) of the copper line 16B to planarize the surface of the device 10B by removing that copper and the diffusion barrier layer 14B where it extends above the surface of IMD layer 12B.

FIG. 5B shows the device 10B of FIG. 5A after a blanket titanium or tantalum refractory metal layer 17 deposited to a thickness of about 300 Å has been deposited upon the surface of device 10B covering the top surface of the planarized lower interconnect copper line 16B and the exposed portions of the surface of IMD layer 12B and layer 14B on the top of device 10B.

FIG. 5C shows the device 10B of FIG. 5B after patterning of the titanium or tantalum refractory metal layer 17 by conventional photolithography and etching techniques to be aligned with the edges of the hole 11B into which layers 14B and 16B.

A disadvantage of the process of FIGS. 5A to 5C is that extra masking is required to pattern the refractory metal layer 17. Another disadvantage is that there is no self-alignment. Furthermore, there is the problem that an extra etching step is required.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An interconnect line on a dielectric layer on a semiconductor device comprising:
    an interconnect trench hole formed in said dielectric layer, said interconnect trench hole having walls, and a bottom formed in said dielectric layer,
    a diffusion barrier formed on said walls and formed on said bottom of said interconnect trench hole,
    said interconnect trench hole filled with a copper metal line, and
    a copper metal alloy layer formed on the surface of said copper metal line encapsulating said copper metal line at the top of said interconnect trench hole.

2. A device in accordance with claim 1 wherein: said device has a top surface planarized to have a coplanarity of said copper metal alloy layer with the topography of said dielectric layer.

3. A device in accordance with claim 1 comprising an interconnect line on a substrate surface wherein:
    an upper dielectric layer is formed on said device above on said dielectric layer and on said copper metal alloy layer,
    an upper interconnect trench hole formed in said upper IMD layer, said upper interconnect trench hole having walls, a top and a bottom extending to the surface of said passivating metal layer,
    an upper diffusion barrier formed on said walls and formed on said passivating metal layer at said bottom of said upper interconnect trench hole, and
    said upper interconnect trench hole being filled with an upper copper metal line.

4. An interconnect line on an IMD layer on a semiconductor device comprising:
    an interconnect trench hole in said IMD layer, said interconnect trench hole having walls and a bottom in said IMD layer,
    a diffusion barrier on said walls and said bottom of said trench hole,
    said interconnect trench hole being filled with copper metal line layer, and
    a passivating copper metal alloy on the surface of said copper metal line encapsulating said copper metal line at the top of said trench hole.

5. A device in accordance with claim 4 wherein: said alloy and said IMD layer have been planarized to have a coplanar surfaces.

6. A device in accordance with claim 4 wherein:

said passivating copper metal alloy on the surface of said copper metal line encapsulating said copper metal line at the top of said interconnect trench hole has a thickness from about 50 Å to about 300 Å.

7. A device in accordance with claim 4 comprising an interconnect line on a substrate surface wherein:

said IMD layer has a top surface, said diffusion barrier layer covering said top surface of said IMD layer, the surface of said device having been polished to planarize said diffusion barrier layer and said copper metal line to achieve coplanarity of said top surface of said device, and an alloy of said copper and said passivating metal formed at the interface thereof.

8. A device in accordance with claim 4 comprising an interconnect line on a substrate surface wherein:

an upper IMD layer is formed on said device above said passivating metal layer, an upper interconnect trench hole in said upper IMD layer, said upper interconnect trench hole having walls, a top and a bottom extending to the surface of said passivating metal layer, an upper diffusion barrier on said walls and said passivating metal layer at said bottom of said upper interconnect trench hole, and said upper interconnect trench hole being filled with an upper copper metal line.

9. An interconnect line on an IMD layer on a semiconductor device comprising:

said IMD layer having a top surface, an interconnect trench hole in said IMD layer, said interconnect trench hole having walls, a top and a bottom in said IMD layer, a diffusion barrier on said walls, on said bottom of said interconnect trench hole and on said top surface of said IMD layer, a deposit of a copper metal line layer covering said diffusion layer and filling said interconnect trench hole with said copper metal line, said copper metal line having a surface covered by an alloy layer of a passivating metal alloy of copper with a passivating metal, and said alloy layer having been planarized to be coplanar with said IMD layer.

10. An interconnect line on an IMD layer on a semiconductor device comprising an interconnect line on a substrate surface wherein:

said IMD layer having a top surface, an interconnect trench hole in said IMD layer, said interconnect trench hole having walls, a top and a bottom in said IMD layer, a diffusion barrier on said walls, on said bottom of said interconnect trench hole and on said top surface of said IMD layer, a deposit of a copper metal line layer covering said diffusion layer and filling said interconnect trench hole with said copper metal line, said copper metal line having a surface covered by an alloy layer of a passivating metal alloy of copper with a passivating metal, said alloy layer planarized to be coplanar with said IMD layer, and said passivating metal layer comprises a metal selected from the group consisting of aluminum, platinum and palladium.

11. An interconnect line on an IMD layer on a semiconductor device comprising an interconnect line on a substrate surface wherein:

said IMD layer having a top surface, an interconnect trench hole in said IMD layer, said interconnect trench hole having walls, a top and a bottom in said IMD layer, a diffusion barrier on said walls, on said bottom of said interconnect trench hole and on said top surface of said IMD layer, a deposit of a copper metal line layer covering said diffusion layer and filling said interconnect trench hole with said copper metal line, said copper metal line having a surface covered by an alloy layer of a passivating metal alloy of copper with a passivating metal, said alloy layer planarized to be coplanar with said IMD layer, said copper is deposited by a process selected from CVD, IMP, electroless and electroplating, and said passivating metal layer comprises a metal selected from aluminum, platinum and palladium.

12. An interconnect line on an IMD layer on a semiconductor device comprising an interconnect line on a substrate surface wherein:

said IMD layer having a top surface, an interconnect trench hole in said IMD layer, said interconnect trench hole having walls, a top and a bottom in said IMD layer, a diffusion barrier on said walls, on said bottom of said interconnect trench hole and on said top surface of said IMD layer, a deposit of a copper metal line layer covering said diffusion layer and filling said interconnect trench hole with said copper metal line, said copper metal line having a surface covered by an alloy layer of a passivating metal alloy of copper with a passivating metal, said alloy layer planarized to be coplanar with said IMD layer, and said passivating metal layer comprises a metal selected from aluminum, platinum and palladium deposited to a thickness from about 50 Å to about 300 Å.

13. A device in accordance with claim 9 comprising an interconnect line on a substrate surface wherein:

said copper was deposited by a process selected from the group consisting of CVD, IMP, electroless and electroplating, said passivating metal layer comprises a metal selected from the group consisting of aluminum, platinum and palladium deposited to a thickness from about 50 Å to about 300 Å, an upper IMD layer is formed of a spin on polymer material on said device above said passivating metal layer, an upper interconnect trench hole in said upper IMD layer, said upper interconnect trench hole having walls, a top and a bottom extending to the surface of said passivating metal layer, an upper diffusion barrier on said walls and said passivating metal layer at said bottom of said upper interconnect trench hole said upper diffusion barrier comprising a refractory metal nitride selected from the group consisting of TiN, TaN and WN, and said upper interconnect trench hole has been filled with an upper copper metal line.

14. An interconnect line on an IMD layer on a semiconductor device comprising:

said IMD layer having a top surface, an interconnect trench hole formed in said IMD layer, said interconnect trench hole having walls, and a bottom formed in said IMD layer, a diffusion barrier formed on said walls, and formed on said bottom of said interconnect trench hole, a deposit of a copper metal layer covering said diffusion layer and filling said interconnect trench hole with a copper metal deposit, said copper metal having been planarized with said IMD layer, and a passivating metal layer formed on the surface of said copper metal deposit encapsulating said copper metal at the top of said interconnect trench hole in a self-aligned configuration.

15. An interconnect line on an IMD layer on a semiconductor device comprising an interconnect line on a substrate surface wherein:

said IMD layer having a top surface, an interconnect trench hole in said IMD layer, said interconnect trench hole having walls, and a bottom in said IMD layer, a diffusion barrier on said walls, on said bottom of said interconnect trench hole, a deposit of a copper metal layer covering said diffusion layer and filling said interconnect trench hole with a copper metal deposit, said copper metal planarized with said IMD layer, a passivating metal layer on the surface of said copper metal deposit encapsulating said copper metal at the top of said interconnect trench hole in a self-aligned configuration, and said passivating metal layer comprises a metal selected from aluminum, platinum and palladium.

16. An interconnect line on an IMD layer on a semiconductor device comprising an interconnect line on a substrate surface wherein:

said IMD layer having a top surface, an interconnect trench hole in said IMD layer, said interconnect trench hole having walls, and a bottom in said IMD layer, a diffusion barrier on said walls, on said bottom of said interconnect trench hole, a deposit of a copper metal layer covering said diffusion layer and filling said interconnect trench hole with a copper metal deposit, said copper metal planarized with said IMD layer, a passivating metal layer on the surface of said copper metal deposit encapsulating said copper metal at the top of said interconnect trench hole in a self-aligned configuration, said copper is deposited by a process selected from CVD, IMP, electroless and electroplating, and said passivating metal layer comprises a metal selected from aluminum, platinum and palladium.

17. An interconnect line on an IMD layer on a semiconductor device comprising an interconnect line on a substrate surface wherein:

said IMD layer having a top surface, an interconnect trench hole in said IMD layer, said interconnect trench hole having walls, and a bottom in said IMD layer, a diffusion barrier on said walls, on said bottom of said interconnect trench hole, a deposit of a copper metal layer covering said diffusion layer and filling said interconnect trench hole with a copper metal deposit, said copper metal planarized with said IMD layer, a passivating metal layer on the surface of said copper metal deposit encapsulating said copper metal at the top of said interconnect trench hole in a self-aligned configuration, and said passivating metal layer comprises a metal selected from the group consisting of aluminum, platinum and palladium deposited to a thickness from about 200 Å to about 300 Å.

* * * * *